(12) United States Patent
Chang

(10) Patent No.: US 8,493,080 B2
(45) Date of Patent: Jul. 23, 2013

(54) TEST SYSTEM AND METHOD

(75) Inventor: Yaw-Guang Chang, Tainan County (TW)

(73) Assignee: Himax Technologies Limited, Tainan (TW)

( * ) Notice: Subject to any disclaimer, the term of this patent is extended or adjusted under 35 U.S.C. 154(b) by 266 days.

(21) Appl. No.: 12/881,417

(22) Filed: Sep. 14, 2010

(65) Prior Publication Data

US 2012/0062247 A1    Mar. 15, 2012

(51) Int. Cl.
*G01R 27/26* (2006.01)
(52) U.S. Cl.
USPC ........... 324/679; 324/658; 324/681; 324/686; 324/750.17; 324/678; 73/780; 73/862.337; 73/514.32; 361/116; 361/287
(58) Field of Classification Search
USPC ................................ 324/679, 686, 50.17, 519
See application file for complete search history.

(56) References Cited

U.S. PATENT DOCUMENTS

| | | | | |
|---|---|---|---|---|
| 6,307,200 B1* | 10/2001 | Kuhnly et al. | ............. | 250/338.1 |
| 6,353,324 B1* | 3/2002 | Uber et al. | ..................... | 324/457 |
| 6,373,264 B1* | 4/2002 | Matsumoto et al. | .......... | 324/667 |
| 2003/0067295 A1* | 4/2003 | Bierer | ........................... | 324/142 |
| 2007/0046639 A1* | 3/2007 | Swedin | ......................... | 345/173 |
| 2007/0159184 A1* | 7/2007 | Reynolds et al. | ............. | 324/662 |
| 2008/0133059 A1* | 6/2008 | Trippel et al. | ................. | 700/267 |
| 2009/0110022 A1* | 4/2009 | Snyder et al. | ..................... | 374/1 |
| 2011/0193489 A1* | 8/2011 | Moss | ............................ | 315/210 |
| 2013/0015866 A1* | 1/2013 | Wendt et al. | .................. | 324/679 |

* cited by examiner

*Primary Examiner* — Arleen M Vazquez
*Assistant Examiner* — Thang Le
(74) *Attorney, Agent, or Firm* — J.C. Patents

(57) ABSTRACT

A test system for testing a capacitive touch sensor is provided. The test system includes a resistor, a signal generator and a micro controller. A first end of the resistor is electrically connected to a sensing port of the capacitive touch sensor. The signal generator provides a test voltage to a second end of the resistor according to control information. In this way, the resistor generates a test current according to the test voltage, and the capacitive touch sensor provides a voltage difference to the sensing port according to a plurality of switching signals, and converts the test current into test information. The micro controller generates the control information according to a test table, and compares the test information according to the test table, so as to determine whether an operation of the capacitive touch sensor is normal.

5 Claims, 4 Drawing Sheets

TEST SYSTEM AND METHOD

BACKGROUND OF THE INVENTION

1. Field of the Invention

The invention relates to a test system and method. More particularly, the invention relates to a test system and method used for testing a capacitive touch sensor.

2. Description of Related Art

FIG. 1 is diagram illustrating a conventional test system of a capacitive touch sensor, wherein the test system 110 is used for testing the capacitive touch sensor 130, and the test system 110 includes a micro controller 111 and a variable capacitor VC1. The variable capacitor VC1 is electrically connected to a sensing port P11 of the capacitive touch sensor 130 to serve as a capacitor to be tested. Moreover, the micro controller 111 is electrically connected to an output port P12 of the capacitive touch sensor 130 for receiving test information D11.

During a test process, the micro controller 111 adjusts a capacitance of the variable capacitor VC1. On the other hand, the capacitive touch sensor 130 controls conductive states of switches SW11 and SW12 through switching signals phA and phB, so as to charge or discharge the variable capacitor VC1. Moreover, an integrating circuit formed by a capacitor C1 and an operational amplifier 131 may convert a current provided by the variable capacitor VC1 into a corresponding integrating voltage VG. Moreover, an analog-to-digital converter (ADC) 132 converts the integrating voltage VG into the corresponding test information D11. In this way, the micro controller 111 in the test system 110 can read the test information D11 to determine whether an operation of the capacitive touch sensor 130 is normal.

However, the capacitive touch sensor 130 is mainly used to detect a tiny capacitance variation, so that the test system 110 must have a precise variable capacitor VC1 for effectively testing the capacitive touch sensor 130. For example, if a resolution of the ADC 132 is 10 bits, and the capacitive touch sensor 130 is used to detect a capacitor with a capacitance range from 4 f to 4.096 p farads, now the test system 110 must have the variable capacitor VC1 with a variable capacitance range from 4 f to 4.096 p farads, and the variable capacitance VC1 must have a feature of fine-tunable for every 4 f farads. However, process variations are usually occurred during a semiconductor fabrication process, so that it is hard to fabricate such precise variable capacitor VC1.

SUMMARY OF THE INVENTION

The invention is directed to a test system, which can reduce a cost for testing a capacitive touch sensor.

The invention is directed to a test method, which can improve an accuracy for testing a capacitive touch sensor.

The invention provides a test system, which is used for testing a capacitive touch sensor, and includes a resistor, a signal generator and a micro controller. A first end of the resistor is electrically connected to a sensing port of the capacitive touch sensor. The signal generator provides a test voltage to a second end of the resistor according to control information. In this way, the resistor generates a test current according to the test voltage, and the capacitive touch sensor provides a voltage difference to the sensing port according to a plurality of switching signals, and converts the test current into test information. The micro controller generates the control information according to a test table, and compares the test information according to the test table, so as to determine whether an operation of the capacitive touch sensor is normal.

In an embodiment of the invention, the micro controller establishes the test table according to the resistor, the voltage difference and a frequency and a duty cycle of the switching signals. Wherein, the test table records a plurality of voltage information and a plurality of capacitance information, and the micro controller selects one of the plurality of voltage information to regard as the control information.

According to another aspect, the invention provides a test method for testing a capacitive touch sensor, the test method includes following steps. A first end of a resistor is electrically connected to a sensing port of the capacitive touch sensor, and control information is generated according to a test table. Moreover, a test voltage is provided to a second end of the resistor according to the control information. In this way, the resistor generates a test current according to the test voltage, and the capacitive touch sensor provides a voltage difference to the sensing port according to a plurality of switching signals, and converts the test current into test information. Then, the test information is received, and the test information is compared according to the test table, so as to determine whether an operation of the capacitive touch sensor is normal.

According to the above descriptions, in the invention, the resistor is electrically connected to the sensing port of the capacitive touch sensor, and the test voltage is provided to the resistor for measurement. In this way, test of the capacitive touch sensor can be implemented without using a capacitor to be tested, so as to reduce a test cost and increase test accuracy.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
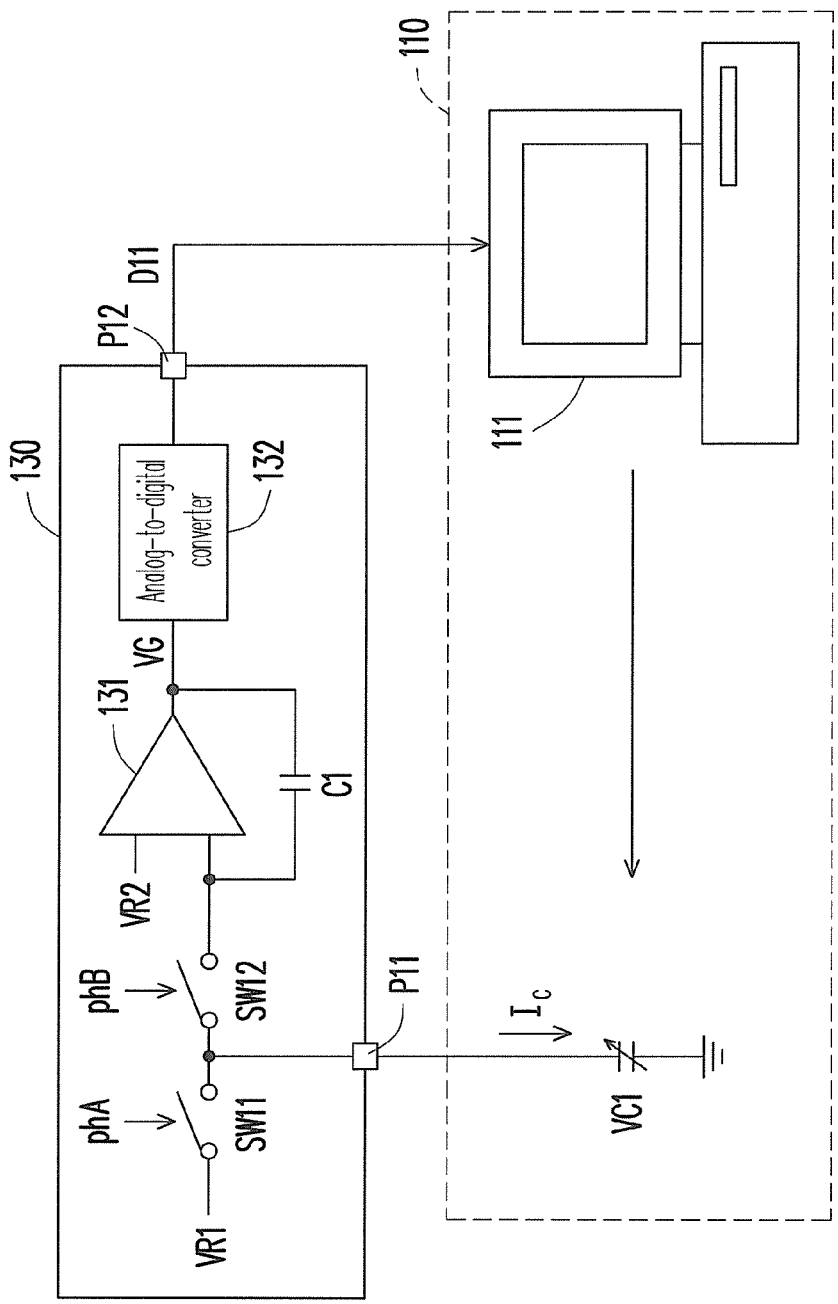
FIG. 1 is diagram illustrating a conventional test system of a capacitive touch sensor.
Figure 2:
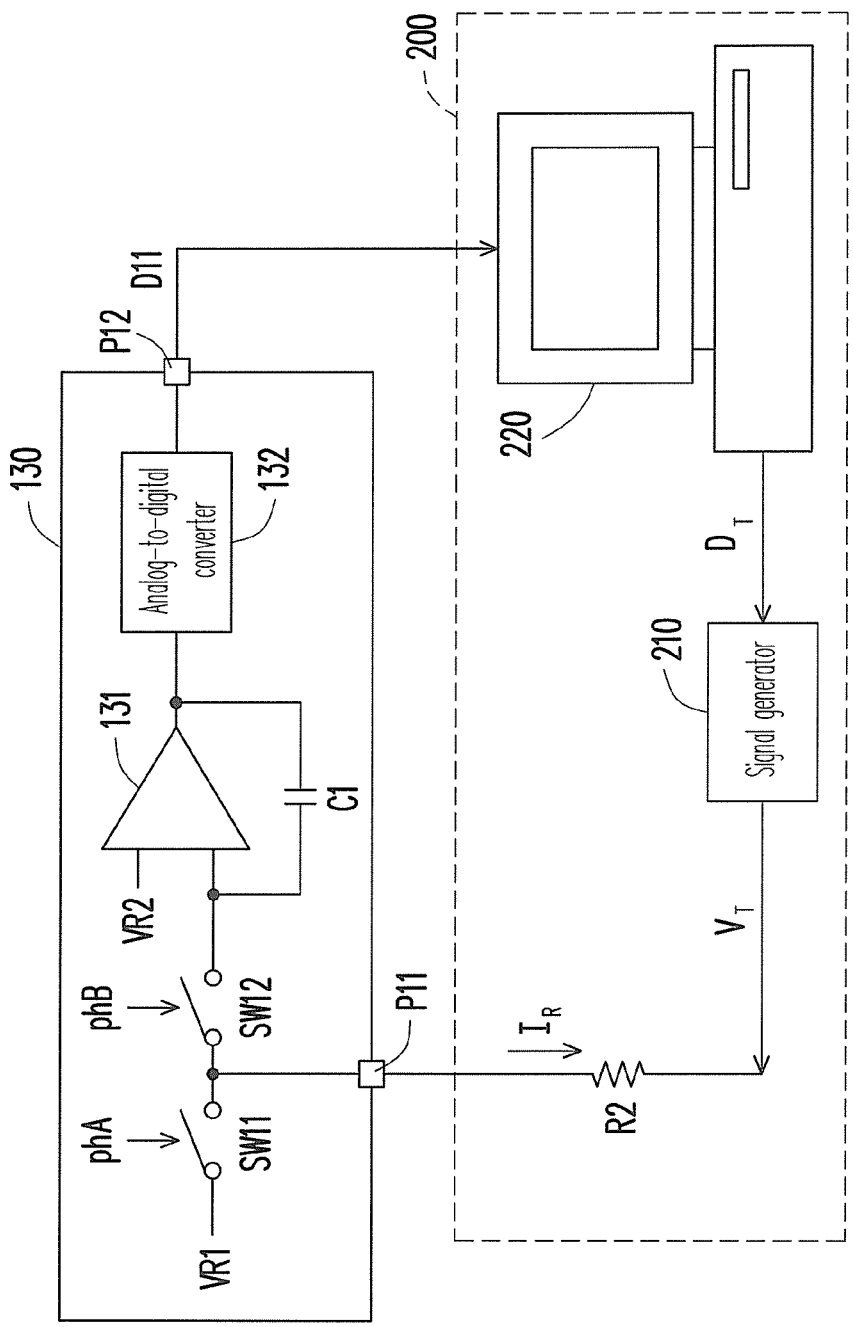
FIG. 2 is a block schematic diagram illustrating a test system according to an embodiment of the invention.

FIG. 2 is a block schematic diagram illustrating a test system according to an embodiment of the invention. The test system 200 is used for testing a capacitive touch sensor. Moreover, for simplicity's sake, the capacitive touch sensor 130 of FIG. 1 is taken as an example.

Referring to FIG. 2, the test system 200 includes a resistor R2, a signal generator 210 and a micro controller 220. Here, a first end of the resistor R2 is electrically connected to a sensing port P11 of the capacitive touch sensor 130, and a second end of the resistor R2 is electrically connected to the signal generator 210. The micro controller 220 is electrically connected to an output port P12 of the capacitive touch sensor 130 and the signal generator 210.

Before the embodiment of the invention is introduced, it should understand that the sensing port P11 of the capacitive touch sensor 130 is switched to an input voltage VR1 or an input voltage VR2 by switching switches SW11 and SW12.

Therefore, the capacitive touch sensor 130 can provide a voltage difference ΔV(VR2−VR1) to the sensing port P11, so as to vary a current of a capacitor to be tested.

In this way, the capacitive touch sensor 130 can detect a magnitude of the capacitor to be tested according to a current variation of the capacitor to be tested. For example, regarding the conventional test system 100 (FIG. 1), when a capacitance of the variable capacitor VC1 is changed, a charge/discharge mechanism provided by the capacitive touch sensor 130 may cause a corresponding variation of a current Ic flowing through the variable capacitor VC1. In this way, the capacitive touch sensor 130 may generate different test information D11 according to the variation of the current Ic and then provides the test information D11 to the back-end micro controller for determination.

However, based on an existing technique, it is hard to fabricate a precise capacitor to be tested (for example, a variable capacitor or a fixed capacitor). Therefore, in the present embodiment, the resistor R2 is used to replace the capacitor to be tested, and the signal generator 210 is used to generate test voltages $V_T$ with different levels to the resistor R2. In this way, along with variation of the test voltages $V_T$, a test current $I_R$ flowing through the resistor R2 is accordingly varied. Moreover, regarding the capacitive touch sensor 130, variation of the test current $I_R$ is equivalent to a current variation caused by different capacitors to be tested.

In other words, each time the test voltage $V_T$ is adjusted, the subsequent variation of the test current $I_R$ is equivalent to a current variation of a certain capacitor to be tested. Therefore, the resistor R2 and the signal generator 210 can be used to simulate different capacitors to be tested. Since the test system 200 of the present embodiment does not apply an actual capacitor for testing, the variation of the test current $I_R$ is regarded as the current variation caused by different virtual capacitors. How to adjust the test voltage $V_T$ to simulate different virtual capacitors is described below.

Here, assuming a level of the test voltage $V_T$ can be adjusted to one of a plurality of reference voltages, and the reference voltages correspond to a plurality of virtual capacitors, a corresponding relationship between an i-th reference voltage VRi and an i-th virtual capacitor CTi relates to the resistor R2, the voltage difference ΔV, a frequency Fre and a duty cycle Dt of the switching signals phA and phB, and the corresponding relationship is shown as a following equation (1):

$$VR_i = \frac{R2}{Dt} \times \Delta V \times Fre \times CT_i \quad (1)$$

Figure 3:
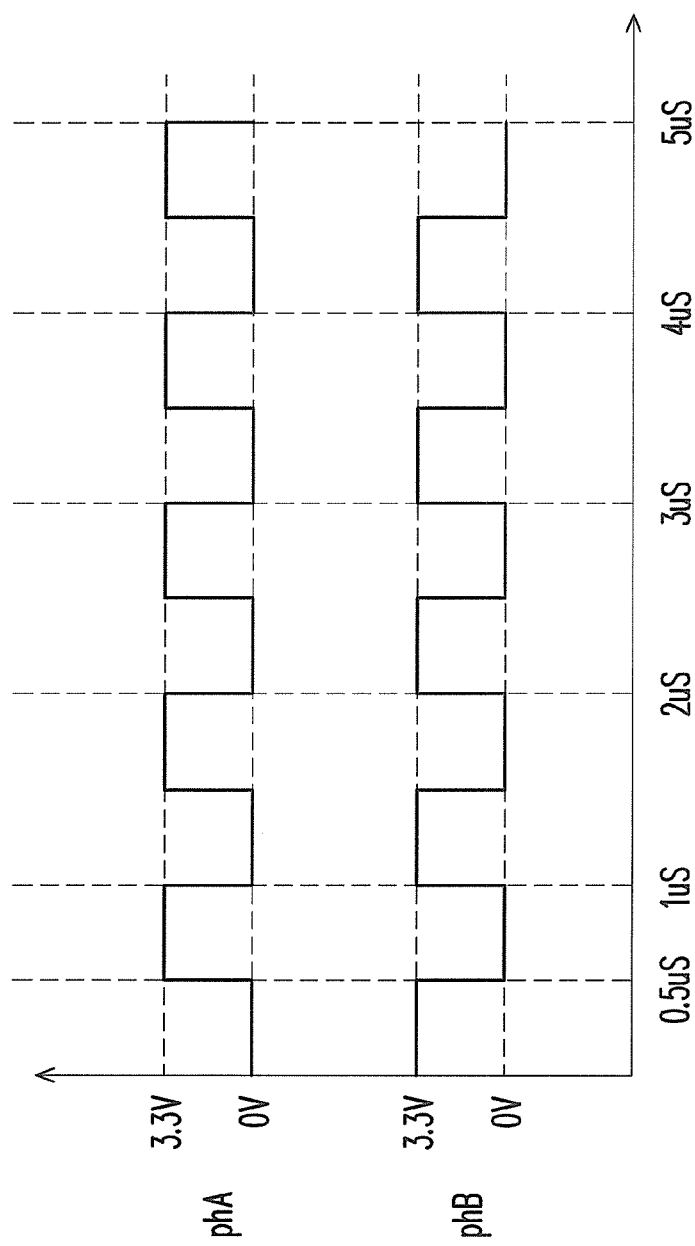
FIG. 3 is a waveform diagram of switching signals of a capacitive touch sensor.

For example, FIG. 3 is a waveform diagram of the switching signals of the capacitive touch sensor, wherein the switching signals phA and phB are mutually inverted, and the frequency Fre of the two signals is 1M (mega, $10^6$) hertz, the duty cycle Dt is 50%. Moreover, if the voltage difference ΔV provided by the capacitive touch sensor 130 is 1 volt, and a resistance of the resistor R2 is 1M ohm, the equation (1) can be simplified to:

$$VR_i = \frac{10^6}{0.5} \times 1 \times 10^6 \times CT_i = (2 \cdot 10^{12}) \times CT_i \quad (1)$$

Now, if the virtual capacitor CTi of 4 f ($10^{-15}$) farads is required to be generated, the reference voltage VRi of 8 m (milli, $10^{-3}$) volts is provided to the resistor R2. The other reference voltages and virtual capacitors can be educed by analogy.

To achieve a digital control, the corresponding relationships of the reference voltages and the virtual capacitors are converted to a plurality of digital voltage information and a plurality of digital capacitance information for storing in a test table of the micro controller 220. In this way, the micro controller 220 may select one of the plurality of voltage information to server as control information, so that the test voltage $V_T$ generated by the signal generator 210 is switched to one of the reference voltages. Comparatively, the test current $I_R$ provided by the resistor R2 is equivalent to a current provided by a certain virtual capacitor.

On the other hand, the capacitive touch sensor 130 may generate the corresponding test information D11. Moreover, to compare whether or not the test information D11 is correct, the micro controller 120 looks up the test table according to the selected voltage information, so as to select one of the plurality of capacitance information. Moreover, the micro controller 120 compares the test information D11 to the selected capacitance information, so as to determine whether the test information D11 is correct. Wherein, if the test information D11 is correct, the micro controller 120 determines that the operation of the capacitive touch sensor is normal. If the test information D11 is incorrect, the micro controller 120 determines that the operation of the capacitive touch sensor is abnormal.

In other words, the micro controller 220 may generate control information $D_T$ according to the test table, and the signal generator 210 may provide a corresponding test voltage $V_T$ according to the control information $D_T$, wherein the signal generator 210 is, for example, a digital-to-analog converter (DAC). In this way, the test voltage $V_T$ is switched to the reference voltages sequentially. Comparatively, each time the test voltage $V_T$ is switched, the capacitive touch sensor 130 may generate the corresponding test information D11. Now, the micro controller 120 compares whether the test information D11 is correct according to the capacitance information recorded by the test table, so as to determine whether the operation of the capacitive touch sensor 130 is normal.

Figure 4:
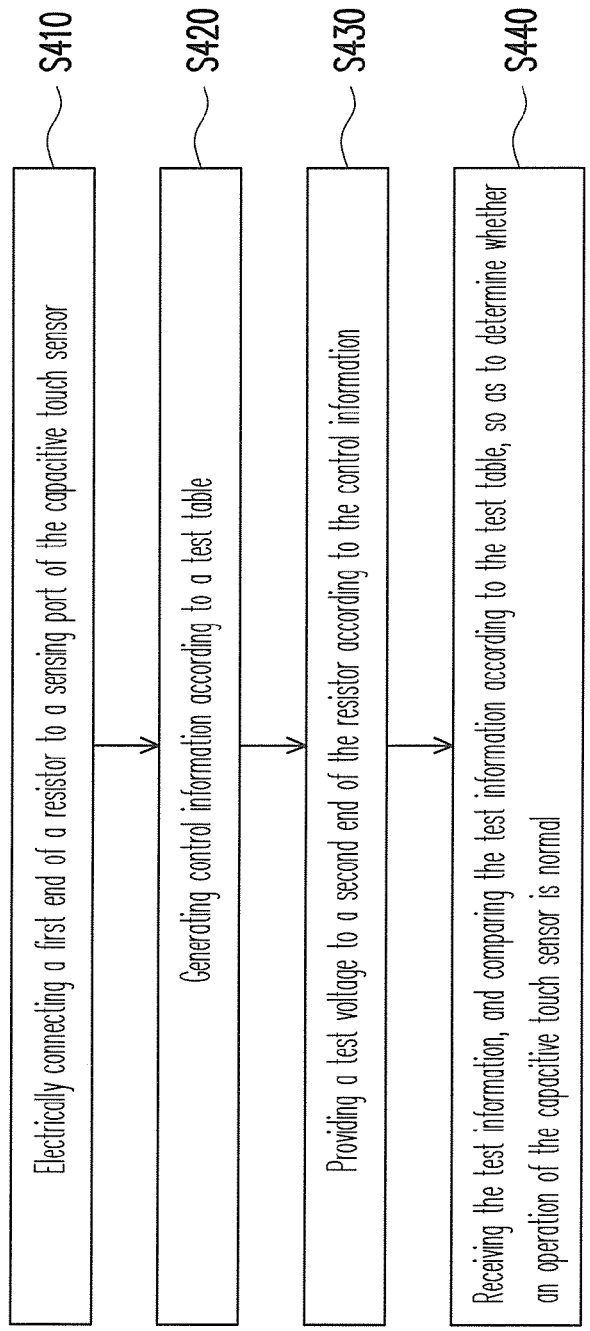
FIG. 4 is a flowchart illustrating a test method according to an embodiment of the invention.

According to another aspect, FIG. 4 is a flowchart illustrating a test method according to an embodiment of the invention, wherein the test method is used to test a capacitive touch sensor. Referring to FIG. 4, in step S410, a first end of a resistor is electrically connected to a sensing port of the capacitive touch sensor. Next, in step S420, control information is generated according to a test table. Moreover, in step S430, a test voltage is provided to a second end of the resistor according to the control information. In this way, the resistor generates a test current according to the test voltage, and the capacitive touch sensor provides a voltage difference to the sensing port according to a plurality of switching signals, and converts the test current into test information. Then, in step S440, the test information is received, and the test information is compared according to the test table, so as to determine whether an operation of the capacitive touch sensor is normal. A detailed flow of the test method of the present embodiment is contained in the aforementioned embodiment, and therefore detailed descriptions thereof are not repeated.

In summary, in the invention, the resistor is electrically connected to the sensing port of the capacitive touch sensor, and the test voltage is provided to the resistor to simulate a current variation caused by different capacitors to be tested. In this way, test of the capacitive touch sensor can be implemented without using a capacitor to be tested, so as to reduce a test cost and increase a test accuracy.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A test system, for testing a capacitive touch sensor, and the test system comprising:
   a resistor, having a first end electrically connected to a sensing port of the capacitive touch sensor, and a second end receiving a test voltage;
   a signal generator, providing the test voltage to the resistor according to control information, wherein the resistor generates a test current according to the test voltage, and the capacitive touch sensor provides a voltage difference to the sensing port according to a plurality of switching signals, and converts the test current into test information; and
   a micro controller, electrically connected to an output port of the capacitive touch sensor for receiving the test information, generating the control information according to a test table, and comparing the test information according to the test table, so as to determine whether an operation of the capacitive touch sensor is normal,
   wherein the micro controller establishes the test table according to the resistor, the voltage difference and a frequency and a duty cycle of the switching signals, wherein the test table records a plurality of voltage information and a plurality of capacitance information, and the micro controller selects one of the plurality of voltage information to regard as the control information.

2. The test system as claimed in claim 1, wherein the signal generator is implemented by a digital-to-analog converter.

3. The test system as claimed in claim 1, wherein the micro controller looks up the test table according to the selected voltage information, so as to select one of the plurality of capacitance information, and the micro controller compares the test information to the selected capacitance information, so as to determine whether the test information is correct, wherein if the test information is correct, the micro controller determines that the operation of the capacitive touch sensor is normal, and if the test information is incorrect, the micro controller determines that the operation of the capacitive touch sensor is abnormal.

4. A test method, for testing a capacitive touch sensor, and the test method comprising:
   electrically connecting a first end of a resistor to a sensing port of the capacitive touch sensor;
   generating control information according to a test table;
   providing a test voltage to a second end of the resistor according to the control information, so that the resistor generates a test current according to the test voltage, and the capacitive touch sensor providing a voltage difference to the sensing port according to a plurality of switching signals, and converting the test current into test information; and
   receiving the test information, and comparing the test information according to the test table, so as to determine whether an operation of the capacitive touch sensor is normal, wherein the step of generating the control information according to the test table comprises:
   establishing the test table according to the resistor, the voltage difference and a frequency and a duty cycle of the switching signals, wherein the test table records a plurality of voltage information and a plurality of capacitance information; and
   selecting one of the plurality of voltage information to regard as the control information.

5. The test method as claimed in claim 4, wherein the step of comparing the test information according to the test table, so as to determine whether the operation of the capacitive touch sensor is normal comprises:
   looking up the test table according to the selected voltage information, so as to select one of the plurality of capacitance information;
   comparing the test information to the selected capacitance information, so as to determine whether the test information is correct;
   determining that the operation of the capacitive touch sensor is normal if the test information is correct; and
   determining that the operation of the capacitive touch sensor is abnormal if the test information is incorrect.

* * * * *